United States Patent
Kim et al.

(10) Patent No.: US 9,656,368 B2
(45) Date of Patent: May 23, 2017

(54) DEVICE FOR GRIPPING SUBSTRATE WITHOUT CONTACT

(71) Applicants: Corning Precision Materials Co., Ltd., Chungcheongnam-do (KR); ZS-Handling GmbH, Regensburg (DE)

(72) Inventors: Chan-Kyu Kim, Chungcheongnam-do (KR); Adolf Zitzmann, Regensburg (DE); KiNam Kim, Chungcheongnam-do (KR); Josef Zimmermann, Regensburg (DE); Michael Schilp, Regensburg (DE)

(73) Assignees: Corning Precision Materials Co., Ltd. (KR); ZS-Handling GmbH (DE)

( * ) Notice: Subject to any disclaimer, the term of this patent is extended or adjusted under 35 U.S.C. 154(b) by 0 days.

(21) Appl. No.: 14/708,837

(22) Filed: May 11, 2015

(65) Prior Publication Data

US 2015/0321321 A1    Nov. 12, 2015

(30) Foreign Application Priority Data

May 12, 2014    (KR) .................. 10-2014-0056259

(51) Int. Cl.
| | | |
|---|---|---|
| *B24B 41/00* | (2006.01) | |
| *B24B 41/06* | (2012.01) | |
| *B25B 11/00* | (2006.01) | |
| *B23Q 3/08* | (2006.01) | |
| *H01L 21/683* | (2006.01) | |
| *H01L 21/67* | (2006.01) | |
| *B65G 47/91* | (2006.01) | |

(52) U.S. Cl.
CPC ............ *B24B 41/005* (2013.01); *B23Q 3/088* (2013.01); *B24B 41/06* (2013.01); *B25B 11/005* (2013.01); *B65G 47/911* (2013.01); *H01L 21/67051* (2013.01); *H01L 21/6838* (2013.01); *H01L 21/67126* (2013.01)

(58) Field of Classification Search
CPC ........ B25B 11/005; B25B 11/02; B25B 13/44
USPC ...................... 269/21, 20, 289 R, 302.1, 900
See application file for complete search history.

(56) References Cited

U.S. PATENT DOCUMENTS

| | | | | |
|---|---|---|---|---|
| 5,998,303 A | * | 12/1999 | Sato .................. | H01L 21/02131 257/E21.276 |
| 7,219,419 B2 | * | 5/2007 | Higashi ............. | H01L 21/67144 156/580.1 |
| 2010/0320786 A1 | * | 12/2010 | Ko ...................... | B25J 15/0616 294/64.3 |

* cited by examiner

*Primary Examiner* — Larry E Waggle, Jr.
*Assistant Examiner* — Seahee Yoon
(74) *Attorney, Agent, or Firm* — Lerner, David, Littenberg, Krumholz & Mentlik, LLP

(57) ABSTRACT

A device for gripping a substrate without contact with which the substrate can be more securely transported. In the device, a housing cap has an air inlet in the upper surface and a lower opening, the lower opening communicating with the air inlet such that air introduced through the air inlet exits through the lower opening. A contour of the lower opening in its vertical cross section is convexly rounded such that the introduced air is guided along a horizontal undersurface of the housing cap. A nozzle is disposed in an inner hollow space of the housing cap, and has an inclined surface such that the width of the nozzle gradually decreases in the direction from the undersurface of the nozzle to the upper surface of the nozzle adjacent to the air inlet. The undersurface of the nozzle is at a predetermined distance from the inner surface of the housing cap. An ultrasonic shaker applies ultrasonic vibration to the housing cap.

7 Claims, 2 Drawing Sheets

DEVICE FOR GRIPPING SUBSTRATE WITHOUT CONTACT

BACKGROUND OF THE INVENTION

Field of the Invention

The present invention relates to a device for gripping a substrate without contact, and more particularly, to a device for gripping a substrate without making contact with the substrate.

Description of Related Art

Glass substrates used for the fabrication of flat panel displays, such as thin film transistor liquid crystal displays (TFT-LCDs), plasma display panels (PDPs) or electroluminescent (EL) devices, are manufactured through the process of converting molten glass that is produced from a glass melting furnace into a flat plate and the process of cutting the flat plate of glass to a preset size before being transported to a machining line where they are machined. In the machining line, glass substrates are cut again to the dimensions of flat panel displays, and four edges of glass substrates are chamfered. Here, the term "chamfering" refers to grinding the edge surfaces that are sharp and have minute cracks.

The substrate-chamfering process of the related art transports glass substrates by holding the glass substrates under the vacuum using a vacuum chuck or gripping the glass substrates using compressed air without making contact therewith.

However, when the vacuum chuck is used, the operation of holding the glass substrates under the vacuum causes minute scratches having the size of 3 μm or less to form on the surface of glass substrates, thereby deteriorating the quality of glass substrates.

In addition, the application of the method of gripping glass substrates using compressed air without making contact therewith has the following problem. When a glass substrate is moved during transportation of the glass substrate since the force of gripping glass substrates in a non-contact state is weak, the glass substrate easily comes into contact with and is damaged by the device for transporting glass substrates without contact. FIG. 1 is a picture showing a scratch formed on a glass substrate by a related-art device for gripping a substrate without contact.

The information disclosed in the Background of the Invention section is provided only for better understanding of the background of the invention, and should not be taken as an acknowledgment or any form of suggestion that this information forms a prior art that would already be known to a person skilled in the art.

RELATED ART DOCUMENT

Patent Document 1: Korean Patent No. 10-0968437 (Jun. 30, 2010)

BRIEF SUMMARY OF THE INVENTION

Various aspects of the present invention provide a device for gripping a substrate without contact with which the substrate can be more securely transported.

In an aspect of the present invention, provided is a device for gripping a substrate without contact that includes: a housing cap having an air inlet in the upper surface through which air is introduced, a lower opening in the lower portion, the lower opening communicating with the air inlet such that the introduced air exits through the lower opening, and an undersurface forming a horizontal surface, wherein the lower opening is rounded in the shape of a convex arc such that the introduced air is guided along the undersurface of the housing cap that forms the horizontal surface; a nozzle disposed in an inner hollow space of the housing cap, wherein the nozzle has an inclined surface, the width thereof gradually decreasing in the direction from the undersurface of the nozzle to the upper surface of the nozzle adjacent to the air inlet, the undersurface of the nozzle being formed at a predetermined distance from the inner surface of the housing cap; and an ultrasonic shaker which applies ultrasonic vibration to the housing cap.

According to an embodiment of the present invention, it is preferred that the ultrasonic shaker apply ultrasonic vibration to the housing cap and the nozzle.

The ultrasonic shaker may include an ultrasonic wave generator which generates an ultrasonic wave and a horn which converts the ultrasonic wave generated by the ultrasonic wave generator into vibration and delivers the vibration to the housing cap.

The undersurface of the nozzle may be formed at a position that is more inward in the upward direction than the horizontal undersurface of the housing cap. It is preferred that the housing cap have a vertical inner surface which extends perpendicularly upward from the lower opening, and that the undersurface of the nozzle be formed at a position that is more inward in the upward direction than a boundary between the lower opening and the vertical inner surface.

In addition, the housing cap may further have a protruding portion which is formed at an upper position than the undersurface of the housing cap.

It is also preferred that the housing cap and the nozzle be symmetric about a vertical line going through the center of the lower opening of the housing cap.

In addition, the device may further include a controller which controls the flow rate of air that is fed through the air inlet and vibration that is generated by the ultrasonic shaker.

According to embodiments of the invention, it is possible to more securely grip a substrate without contact.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
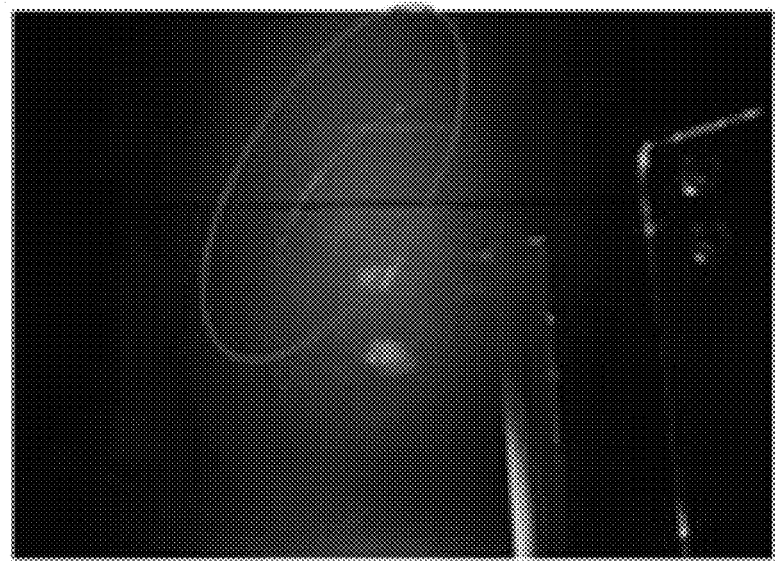
FIG. 1 is a picture showing a scratch formed on a glass substrate by a device for gripping a substrate without contact of the related art.

Reference will now be made in detail to a device for gripping a substrate without contact according to the present invention, various embodiments of which are illustrated in the accompanying drawings and described below, so that a person having ordinary skill in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

Figure 2:
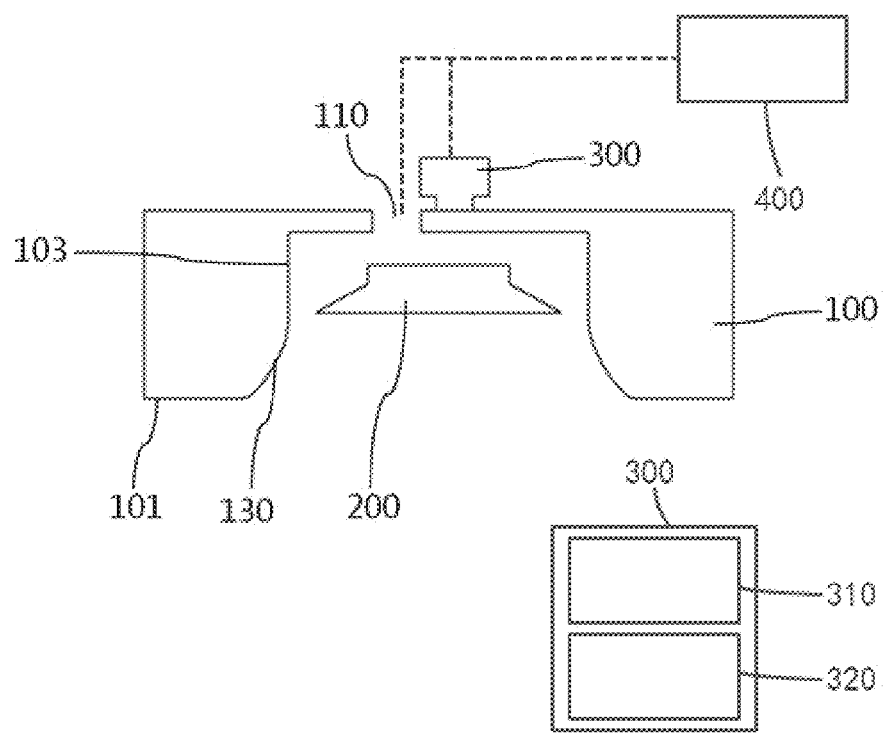
FIG. 2 is a schematic cross-sectional view showing a device for gripping a substrate without contact according to an embodiment of the invention.
Figure 3:
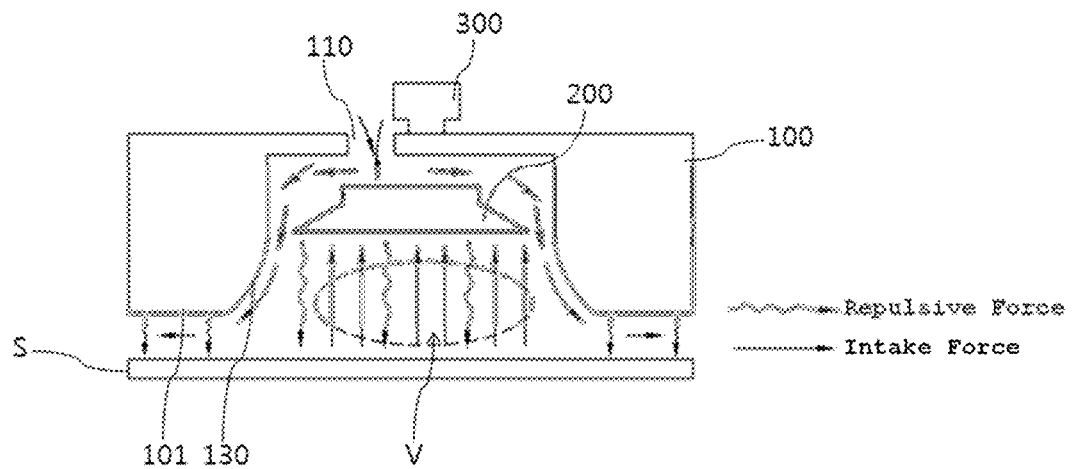
FIG. 3 is a cross-sectional view illustrating a force that is applied to a substrate by the device for gripping a substrate without contact in FIG. 2.

FIG. 2 is a schematic cross-sectional view showing a device for gripping a substrate without contact according to an embodiment of the invention, and FIG. 3 is a cross-sectional view illustrating a force that is applied to a substrate by the device for gripping a substrate without contact in FIG. 2.

The device for gripping a substrate without contact according to an embodiment of the invention is a handling device which transports or turns over a substrate, a wafer, or the like without making contact therewith. As shown in FIG. 2, the device for gripping a substrate without contact includes a housing cap 100, a nozzle 200 and an ultrasonic shaker 300.

The housing cap 100 has an air inlet 110 in the upper surface through which air is introduced and a lower opening 130 in the lower portion, the lower opening 130 communicating with the air inlet 100 such that the introduced air exits through the lower opening 130. The undersurface 101 of the housing cap 100 is a horizontal surface such that it can form a closed curved surface when in contact with a substrate or the like.

In the vertical cross section of the lower opening, a contour of the lower opening 130 is rounded in the shape of a convex arc such that air is guided along the undersurface 101 of the housing cap 100. Since the lower opening 130 is convexly rounded, air that has been introduced through the air inlet 110 can be guided along the undersurface 101 with a minimum loss in the flow rate of the air.

The nozzle 200 is disposed in the inner hollow space of the housing cap 100. The nozzle 200 has an inclined surface, the width thereof gradually decreasing in the direction from the undersurface of the nozzle to the upper surface adjacent to the air inlet 110. The undersurface of the nozzle is formed at a preset distance from the inner surface of the housing cap 100.

Since the housing cap 100 and the nozzle 200 are formed as such, the substrate disposed below the housing cap 100 can be gripped without contact.

Describing in more detail with reference to FIG. 3, when compressed air or compressed dry air is introduced through the air inlet 110 in order to grip a substrate S without making contact therewith, the introduced air passes through the space between the inner surface of the housing cap 100 and the undersurface of the nozzle 200, flows through the lower opening 130 which is rounded in the shape of a convex arc due to the Coanda effect, and then exits the housing cap along the horizontal undersurface 101 of the housing cap 100.

Here, the Coanda effect refers to the tendency of fluid to flow in the direction toward less energy consumption. Due to this effect, fluid that flows along a curved pipe flows along the curved pipe instead of flowing in the proceeding direction. That is, the air discharged through the space between the inner surface of the housing cap 100 and the undersurface of the nozzle 200 flows along the inner surface of the housing cap and exits the housing cap 100 along the undersurface 101 of the housing cap instead of flowing in the direction in which it is discharged.

When the introduced air drains to the outside of the housing cap 100 along the undersurface 101 of the housing cap, vacuum is created in the space V between the substrate S (see FIG. 3) and the undersurface of the housing cap 101 due to the Bernoulli effect, thereby creating negative pressure. The pressure created in this fashion draws the substrate S in the direction toward the undersurface 101 of the housing cap. At this time, since the air is draining to the outside along the undersurface 101 of the housing cap, the substrate S is held at a preset distance from the undersurface 101 of the housing cap without making contact with undersurface 101 of the housing cap. That is, the substrate S stays at a preset distance from the undersurface 101 of the housing cap, the distance being determined by the difference between the negative pressure and the pressure under which the air is discharged along the undersurface 101.

In addition, in order to assist in the creation of the Coanda effect, the undersurface of the nozzle 200 is preferably formed at a position that is more inward in the direction toward the air inlet 110 than the horizontal undersurface 101 of the housing cap.

More preferably, the housing cap 100 has a vertical inner surface 103 which extends perpendicularly upward from the lower opening 130, and the undersurface of the nozzle 200 is formed at a position that is more inward in the direction toward the air inlet 110 than the boundary between the rounded lower opening 130 and the vertical inner surface 103.

In addition, in order to more securely grip the substrate, it is preferred that the housing cap 100 and the nozzle 20 be configured to be symmetric about a vertical line going through the center of the lower opening of the housing cap.

The closed curved surface defined by the undersurface 101 of the housing cap may have a variety of shapes, such as a circle, an oblong or an oval.

The ultrasonic shaker 300 applies ultrasonic vibration to the housing cap 100.

When the ultrasonic shaker 300 applies the ultrasonic vibration to the housing cap 100, periodic air compression due to ultrasonic vibration of the housing cap 100 generates a repulsive force that pushes the substrate S. That is, the vibration of the housing cap 100 enhances the repulsive force that serves to hold the substrate S in a non-contact state in response to the negative pressure (intake force) that is generated by the Bernoulli effect to draw the substrate S, thereby preventing the substrate S from coming into contact with the housing cap 100 while the substrate is being handled.

Since the repulsive force generated at this time is uniform over the entire surface of the housing cap 100, it is possible to very securely push the substrate S.

In addition, since the repulsive force generated due to the ultrasonic vibration of the housing cap 100 is automatically adjusted in response to an unstable state, such as vibration, shaking or the like of the substrate S, the substrate S can be securely gripped.

The ultrasonic shaker 300 can include an ultrasonic wave generator 310 which generates an ultrasonic wave and a horn 320 which converts the ultrasonic wave generated by the ultrasonic wave generator 310 into vibration and delivers the vibration to the housing cap 100. Here, the ultrasonic wave generator 310 can include an ultrasonic wave transducer which generates an ultrasonic wave in response to voltages applied from the outside. In addition, the horn 320 converts the ultrasonic wave generated by the ultrasonic wave generator 310 into a preset vibration amplitude and delivers the converted vibration amplitude to the housing cap 100.

Preferably, the ultrasonic shaker 300 applies ultrasonic vibrations to the housing cap 100 and the nozzle 200.

Figure 4:
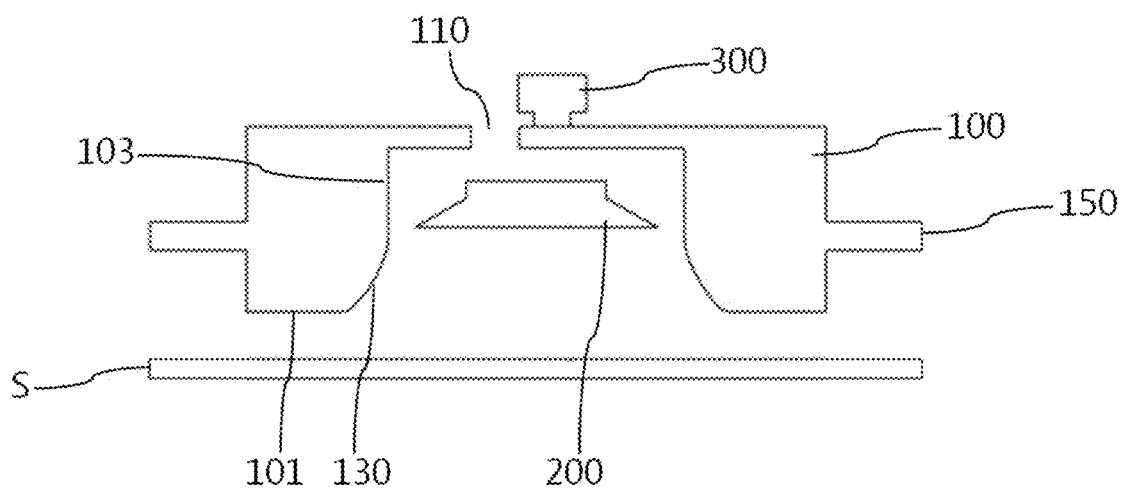
FIG. 4 is a schematic cross-sectional view showing a device for gripping a substrate without contact according to another embodiment of the invention.

In addition, referring to FIG. 4, in the device for gripping a substrate without contact according to an embodiment of the invention, the housing cap 100 further has a protruding portion 150 on an outer surface of the housing cap, which is formed at an upper position than the undersurface 101 of the housing cap.

Since the housing cap 100 further has the protruding portion 150, it is also possible to apply the repulsive force to the substrate S through the protruding portion 150, thereby more securely gripping the substrate S.

Since the protruding portion 150 is configured as above, it is possible to prevent the substrate S from coming into contact with the protruding portion 150 of the housing cap when the substrate S moves during the substrate handling process.

In addition, the device for gripping a substrate without contact according to an embodiment of the invention can further include a controller 400 which controls the flow rate of air that is fed through the air inlet 110 and vibration that is generated by the ultrasonic shaker 300.

Since the distance between the undersurface 101 of the housing cap and the substrate S relates to the flow rate of the air that is fed through the air inlet 110 and the intensity of vibration that is generated by the ultrasonic shaker 300, it is possible to securely handle the substrate S by properly controlling the flow rate of the air and the intensity of the vibration using the controller 400.

It is preferred that the distance between the undersurface 101 of the housing cap and the substrate S be about 1.5 mm. In addition, when the protruding portion 150 of the housing cap is formed at an upper positing than the undersurface 101, it is preferred that the distance between the protruding portion 150 of the housing cap and the substrate S be about 6 mm.

The foregoing descriptions of specific exemplary embodiments of the present invention have been presented with respect to the drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. A device for gripping a substrate without contact comprising:
   a housing cap in which
      an air inlet through which air is introduced is formed in an upper surface and communicates with a lower opening such that the introduced air exits through the lower opening,
      an undersurface surrounding the lower opening forms a horizontal surface,
      a contour of the lower opening in its vertical cross section is convexly rounded such that the introduced air is guided along the undersurface of the housing cap;
   a nozzle disposed in an inner hollow space of the housing cap, wherein the nozzle has an inclined surface such that a width of the nozzle gradually decreasing in a direction from an undersurface of the nozzle to an upper surface of the nozzle, the undersurface of the nozzle being formed at a predetermined distance from an inner surface of the housing cap; and
   an ultrasonic shaker which applies ultrasonic vibration to the housing cap,
   wherein the housing cap has a protruding portion which is formed at an upper position than the undersurface of the housing cap,
   wherein the protruding portion is formed in a horizontal direction from sides of the housing cap.

2. The device according to claim 1, wherein the ultrasonic shaker further applies ultrasonic vibration to the nozzle.

3. The device according to claim 1, wherein the ultrasonic shaker includes an ultrasonic wave generator which generates an ultrasonic wave and a horn which converts the ultrasonic wave into the ultrasonic vibration and delivers the ultrasonic vibration to the housing cap.

4. The device according to claim 1, wherein the undersurface of the nozzle is formed at another upper position than the horizontal undersurface of the housing cap.

5. The device according to claim 4, wherein
   the inner surface of the housing cap extends perpendicularly upward from the lower opening, and
   the undersurface of the nozzle is formed at an additional upper position than a boundary between the rounded lower opening and the inner surface.

6. The device according to claim 1, wherein the housing cap and the nozzle are symmetric about a vertical line going through a center of the lower opening.

7. The device according to claim 1, further comprising a controller which controls a flow rate of the air that is fed through the air inlet and the ultrasonic vibration that is generated by the ultrasonic shaker.

* * * * *